United States Patent
Onodera et al.

(10) Patent No.: US 8,101,945 B2
(45) Date of Patent: Jan. 24, 2012

(54) LAMINATED STRUCTURE, FORMING METHOD OF THE SAME, WIRING BOARD, MATRIX SUBSTRATE AND ELECTRONIC DISPLAY APPARATUS

(75) Inventors: Atsushi Onodera, Tokyo (JP); Hidenori Tomono, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 523 days.

(21) Appl. No.: 12/212,319

(22) Filed: Sep. 17, 2008

(65) Prior Publication Data
US 2009/0071701 A1 Mar. 19, 2009

(30) Foreign Application Priority Data
Sep. 19, 2007 (JP) .................. 2007-242751

(51) Int. Cl.
H01L 35/24 (2006.01)
H01L 51/48 (2006.01)
(52) U.S. Cl. .......... 257/40; 438/151; 438/164; 438/674
(58) Field of Classification Search ............. 257/528
See application file for complete search history.

(56) References Cited

U.S. PATENT DOCUMENTS
2005/0163938 A1* 7/2005 Yamazaki et al. ........... 427/554
2006/0160277 A1* 7/2006 Sirringhaus et al. ........ 438/149
2007/0116877 A1 5/2007 Sakai et al.
2008/0029766 A1 2/2008 Onodera et al.

FOREIGN PATENT DOCUMENTS
JP 2005-310962 11/2005
JP 2006-108148 4/2006
JP 2006-221059 8/2006

OTHER PUBLICATIONS
Jun. 1, 2011 European search report in connection with counterpart European patent application No. 08 25 3047.

* cited by examiner

*Primary Examiner* — Ha Tran T Nguyen
*Assistant Examiner* — Raj R Gupta
(74) *Attorney, Agent, or Firm* — Cooper & Dunham LLP

(57) ABSTRACT

A disclosed laminated structure includes a wettability variable layer containing a wettability variable material whose surface energy changes when energy is applied thereto and including at least a high surface energy area having high surface energy and a low surface energy area having low surface energy; and a conductive layer disposed on the high surface energy area. The conductive layer includes a first high surface energy area, a second high surface energy area smaller in width than the first high surface energy area, and a third high surface energy area smaller in width than the second high surface energy area. The first high surface energy area and the second high surface energy area are connected by the third high surface energy area.

13 Claims, 15 Drawing Sheets

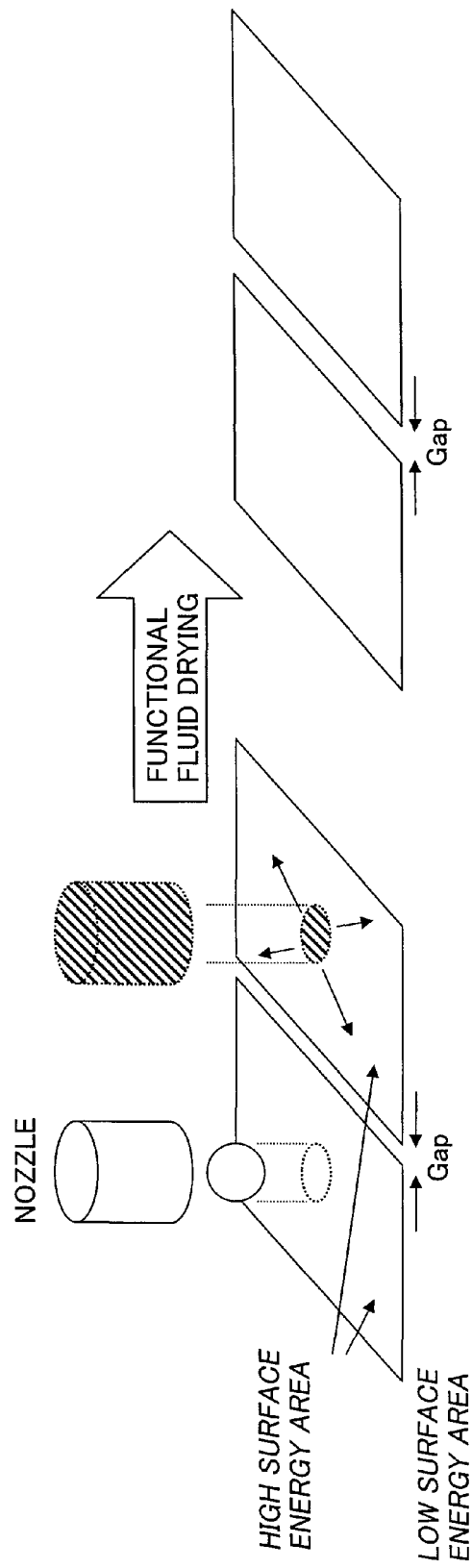

[LATERAL VIEW]

[TOP VIEW]

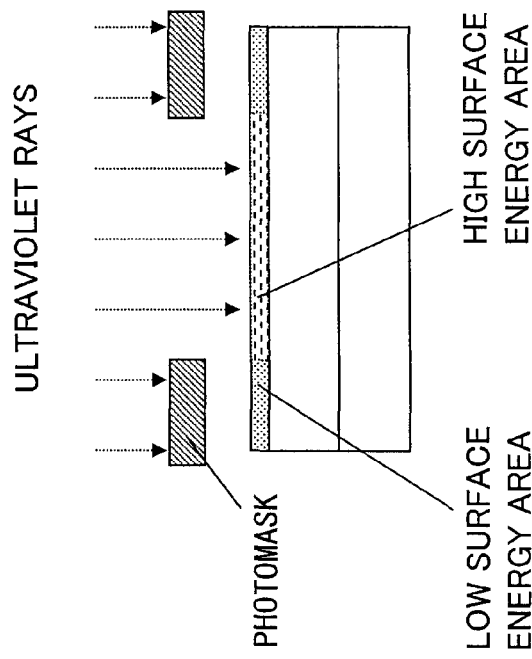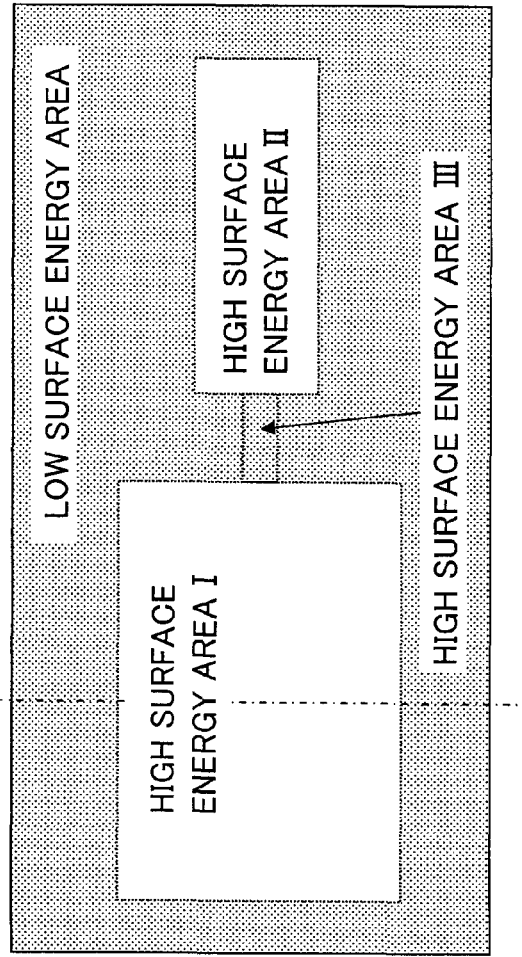
FIG.3A [TOP VIEW]
FIG.3B [CROSS-SECTION VIEW I]

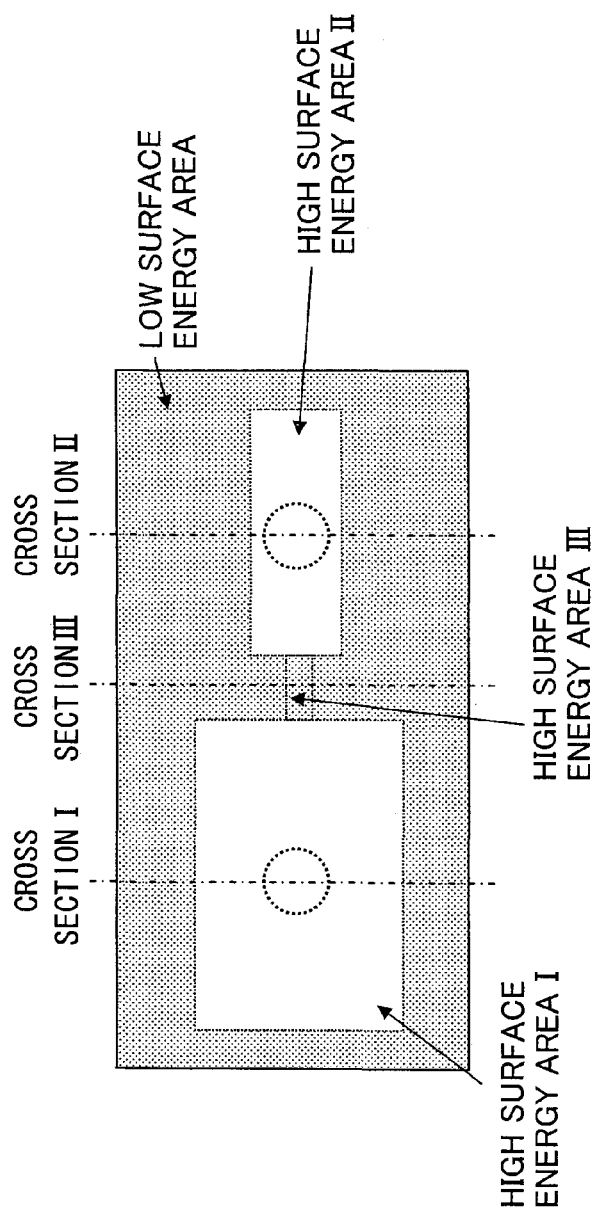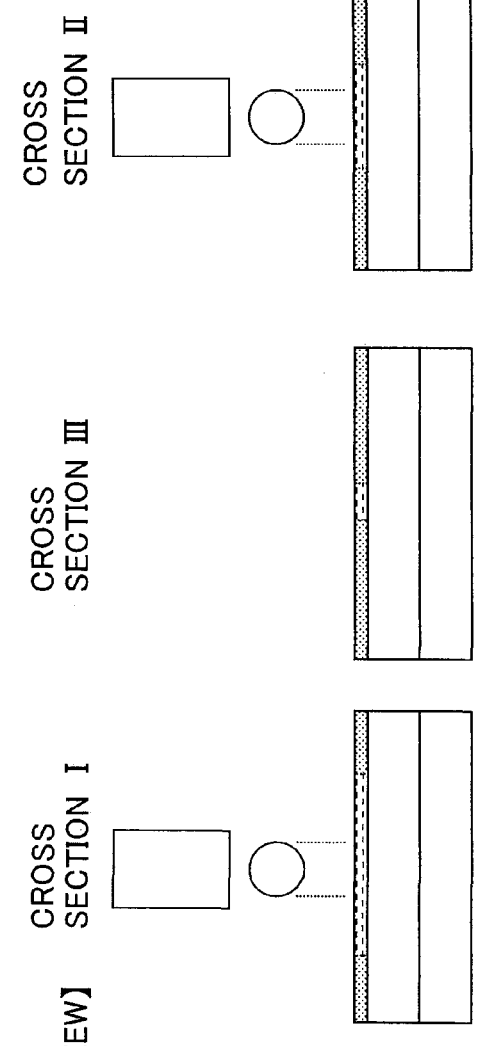
FIG.4A [TOP VIEW]
FIG.4B [CROSS-SECTION VIEW]

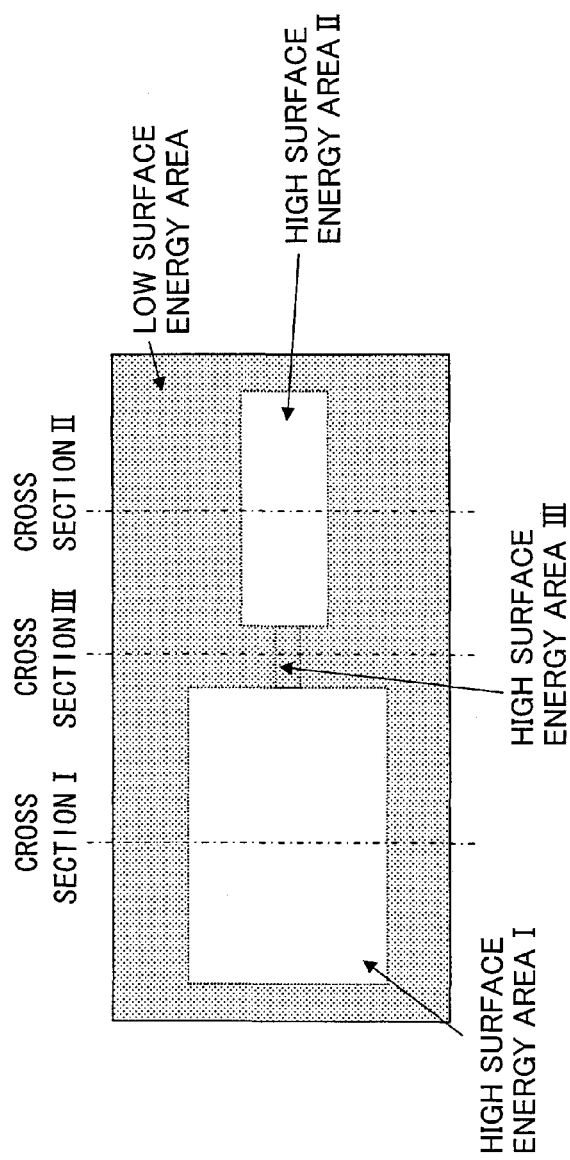
FIG.5A [TOP VIEW]
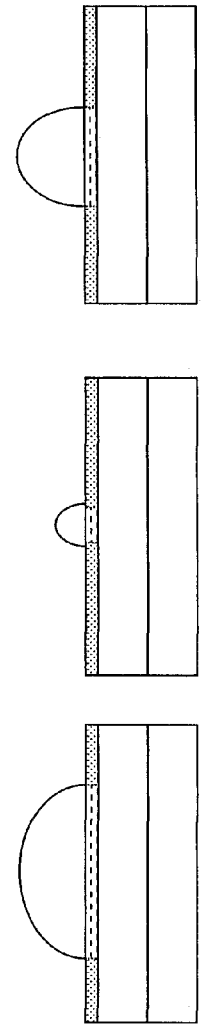
FIG.5B [CROSS-SECTION VIEW]

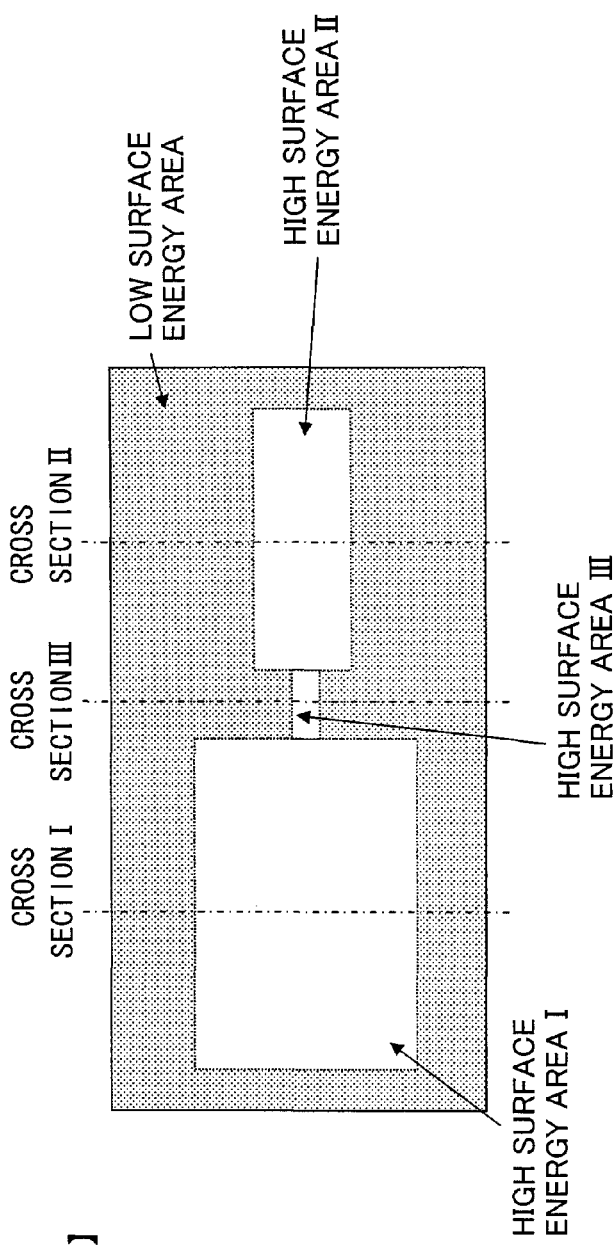
FIG.6A [TOP VIEW]
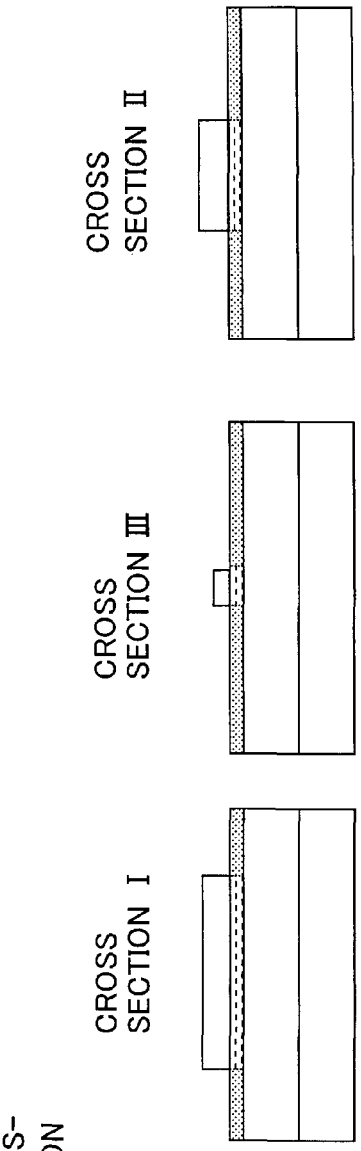
FIG.6B [CROSS-SECTION VIEW]

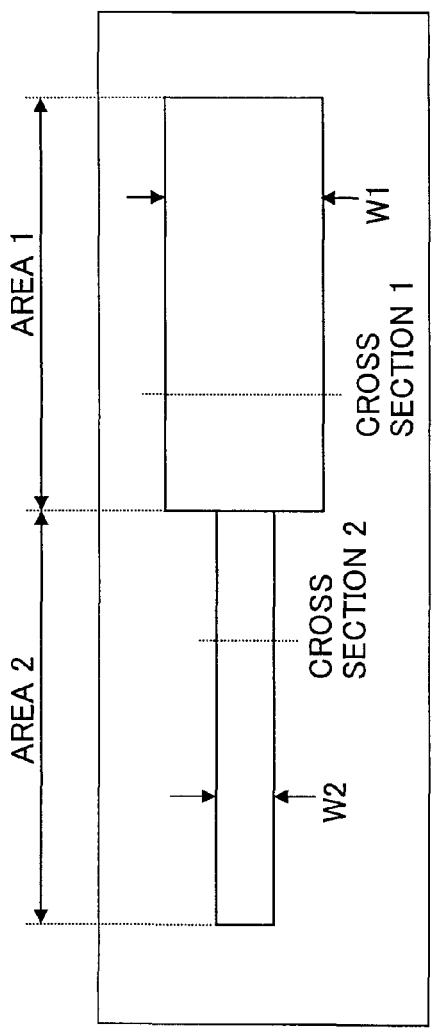
FIG.8A [TOP VIEW]
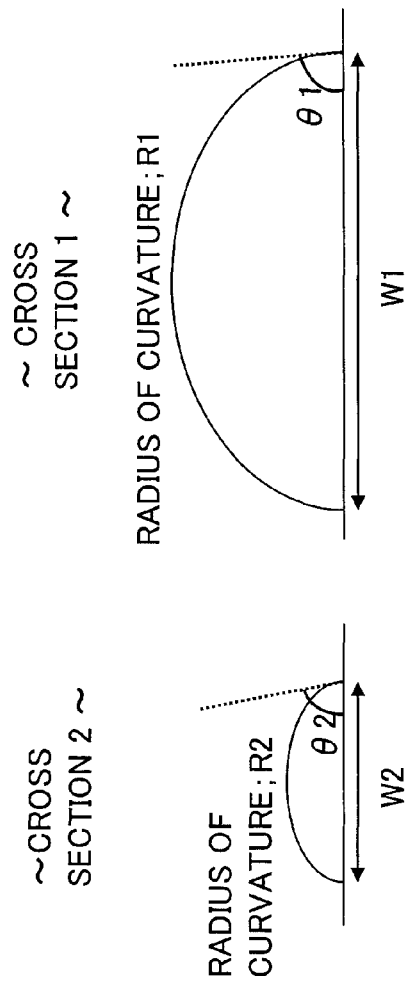
FIG.8B [CROSS-SECTION VIEW]

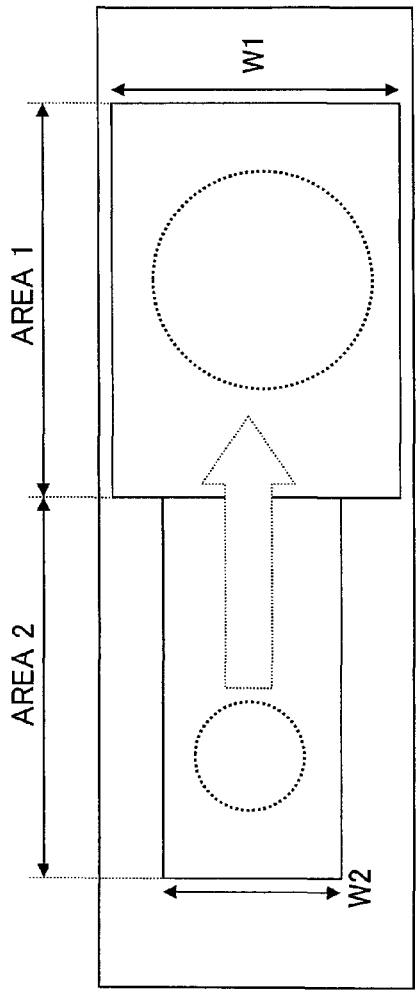
FIG.9A
CONVENTIONAL
PRESENT INVENTION

CONVENTIONAL METHOD FOR
FORMING CAPACITOR ELECTRODE

METHOD FOR FORMING CAPACITOR ELECTRODE
ACCORDING TO ONE EMBODIMENT OF PRESENT INVENTION

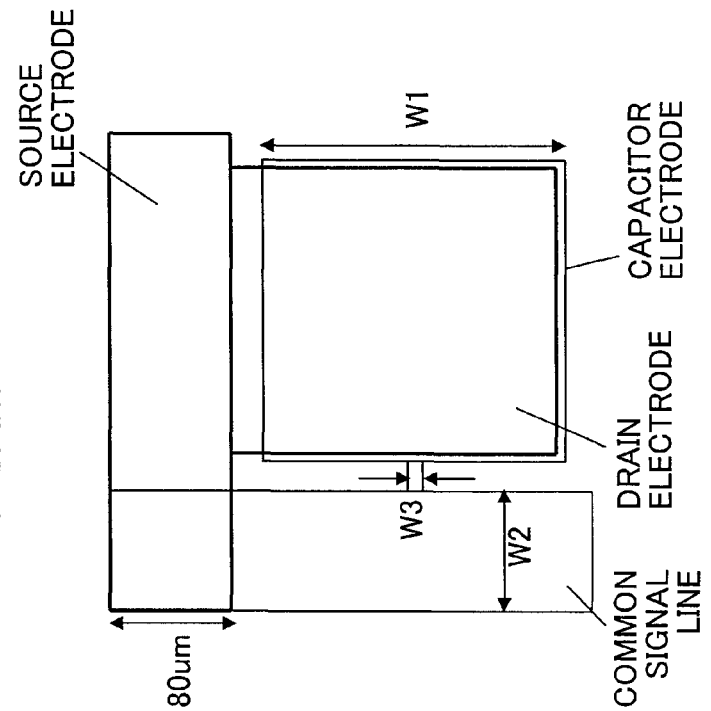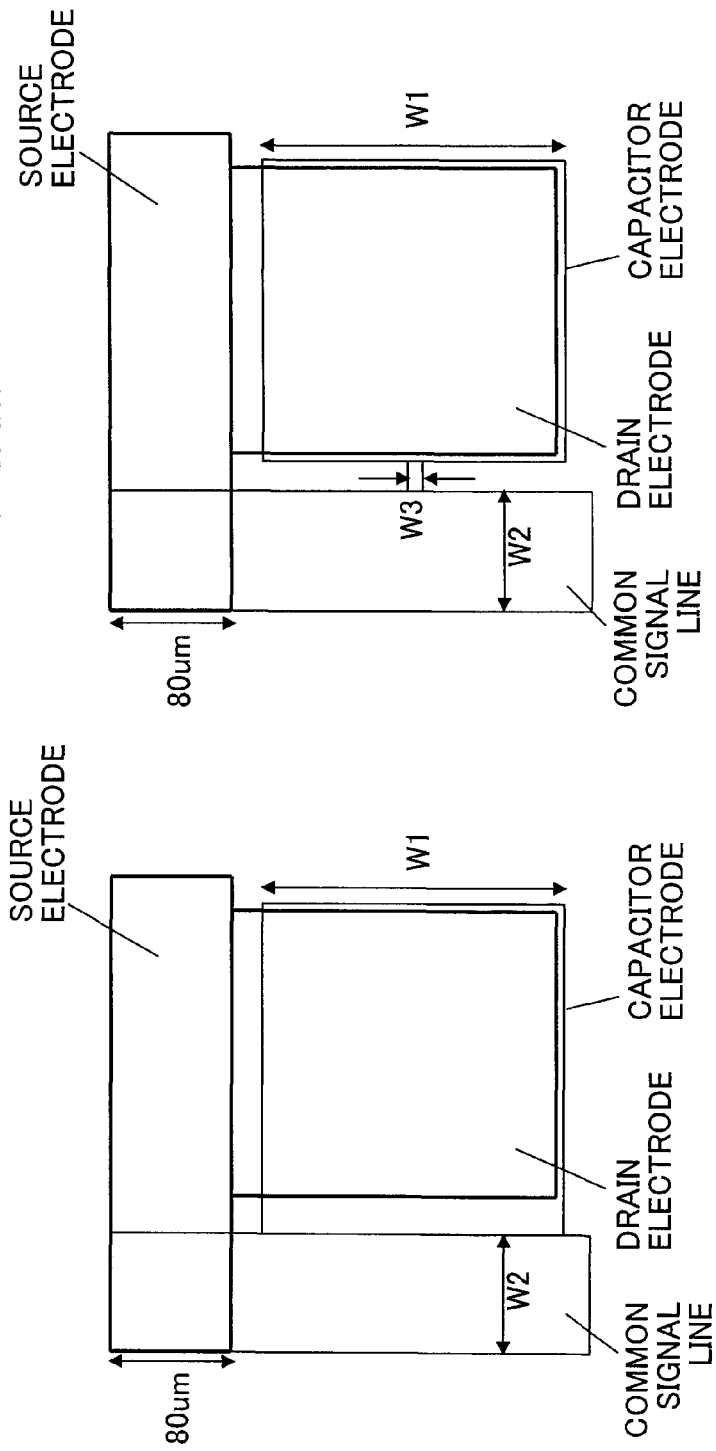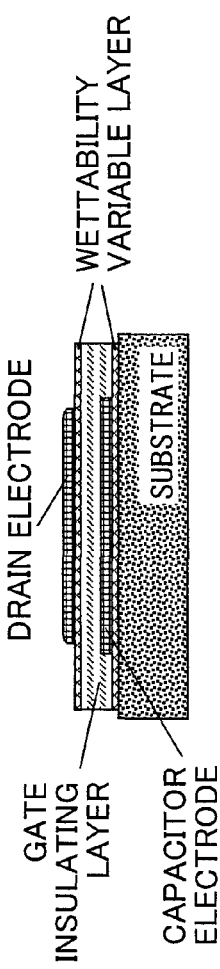

LAMINATED STRUCTURE, FORMING METHOD OF THE SAME, WIRING BOARD, MATRIX SUBSTRATE AND ELECTRONIC DISPLAY APPARATUS

BACKGROUND

1. Technical Field

This disclosure relates to a laminated structure, a forming method of the laminated structure, a wiring board having the laminated structure, a matrix substrate having the laminated structure, and an electronic display apparatus having the matrix substrate.

2. Description of the Related Art

In recent years, printing methods have gained much attention for forming patterns of functional materials (such as conductive materials, insulators and semiconductors) that are used for circuit substrates. In a typical printing method, a pattern is formed by supplying a predetermined amount of a print material containing a functional material to specified areas of a substrate. This technique has advantages over conventional photolithography in terms of the needlessness of large-scale equipment, lesser number of pattern forming steps and high efficiency in the use of materials. A typical example of an application of the printing method to a circuit substrate is an active matrix substrate used as a driver circuit of an electronic display apparatus.

In order to improve performance of a circuit substrate, it is necessary to microfabricate a pattern of functional materials which are components of a circuit. The printing method excels over the photolithographic method in terms of cost reduction; however, photolithography offers better performance in pattern microfabrication, enabling pattern formation at the micrometer level.

For example, in the case where inkjet printing is used as the printing method, excess functional fluid tends to spread on the substrate or to agglomerate and form a mass. This problem makes it difficult to microfabricate a functional material pattern. In order to solve the problem, a technology for manufacturing a laminated structure has been proposed. According to the manufacturing technology, the surface of the substrate is treated prior to application of the functional fluid so as to control wettability of the substrate by the functional fluid (see Patent Document 1, for example). With the treatment of the substrate surface, a high surface energy area having high wettability for the functional fluid and a low surface energy area having low wettability for the functional fluid are formed on the surface. Then, the functional fluid which contains a conductive material is selectively supplied only to the high surface energy area. As shown in FIG. 1, the functional fluid deposited on the high surface energy area spreads across the high surface energy area and then stops at the boundary with the low surface energy area, which allows forming a microscopic space of 10 μm or less. This technology has an advantage of being able to form a microscopic laminated structure by simple processes, as described below.

Patent Document 1 discloses a technology capable of microfabricating electrodes due to being able to keep excess functional fluid from spreading across the substrate or prevent the functional fluid from agglomerating and forming a mass; however, the technology is limited in its controllability of layer thickness. More specifically, in the case where two areas having different widths from each other are present in the high surface energy area, flow of the functional fluid occurs between these two areas. As a result, the amount of the functional fluid per unit area becomes different between the two areas, which in turn results in a difference in the thickness of electrodes formed in the two areas after drying of the functional fluid. This is a common problem in using a functional fluid supply means, such as inkjet printing or dispenser printing, and becomes pronounced since the functional fluid used has a surface tension as low as several tens of mN/m.

To address the problem, a conventional technique proposes, instead of directly connecting the areas having different widths, separating these areas or providing a barrier structure—such as a groove or a projection—at the connection between them (see e.g. Patent Document 2, particularly FIGS. 6 and 8). According to this technique, first, two electrodes having different widths are separately formed by a functional fluid supply means, and subsequently additional functional fluid is supplied to bridge the two electrodes, thereby obtaining two electrodes having different widths but having the same thickness. However, the method of separately forming electrodes and later connecting them involves complex operations, and also there is a concern of a decrease in the continuity and reliability of the electrodes after drying and solidification.

Another technique proposes providing banks (mounds) on the substrate and forming a convex structure in a groove between the banks, and thus enabling the banks to have little or no affinity for the functional fluid (lyophobic) and enabling the groove between the banks to have a strong affinity for the functional fluid (lyophilic) due to the surface tension of the functional fluid (see Patent Document 3, for example). Even in the case where the functional fluid is supplied to the lyophilic area, the banks serve as barriers and thereby the functional fluid accumulates in the groove between the banks. In addition, the convex structure restricts the flow of the functional fluid. As a result, it is possible to obtain electrodes having a uniform thickness. This technique is capable of, without separately forming electrodes, controlling the thickness of the electrodes using the banks and convex structure, the thicknesses of which can be changed. However, the method requires photolithography to create the banks and convex structure, thus requiring many operational steps. In addition, a great part of the materials is to be discarded. Therefore, the advantages of the functional fluid supply means are not fully utilized.

Thus, it is difficult for the conventional functional fluid supply means to control the flow of the functional fluid and form arbitrary-shaped electrodes having a uniform thickness. In addition, previously proposed methods for controlling the thickness using a functional fluid supply means require overly complicated operations and do not fully make use of the advantages of the functional fluid supply means.

Patent Document 1: Japanese Laid-open Patent Application Publication No. 2005-310962

Patent Document 2: Japanese Laid-open Patent Application Publication No. 2006-221059

Patent Document 3: Japanese Laid-open Patent Application Publication No. 2006-108148

The present invention has been made in view of the problems of the above-mentioned conventional approaches, and aims at providing a laminated structure derived by establishing a technology for forming a uniform layer thickness of a laminated structure using a functional fluid supply means (such as an inkjet method); and a wiring board, an active matrix substrate and an electronic display apparatus that use the laminated structure. The present invention also aims at providing a simple method for manufacturing the laminated structure at low cost.

Patent Document 1 discloses that by applying energy (such as ultraviolet light) to a wettability variable layer containing a wettability variable material whose surface energy changes when energy is applied thereto, areas having different wettabilities can be created on the wettability variable layer. Herewith, electrodes can be selectively formed on the wettability variable layer. Patent Document 1 also discusses that by using a laminated structure including the wettability variable layer, it is possible to provide a high-performance electronic device by a simple manufacturing process.

As a result of keen examination to solve the above-mentioned problems, the present inventors achieved the present invention by finding the following new fact. That is, even if the functional fluid is applied separately to a first high surface energy area (hereinafter referred to simply as "first area") and a second high surface energy area ("second area") on the wettability variable layer, the thickness of a first and a second conductive region can be controlled by preventing the flow of the functional fluid between the first and the second areas by a third high surface energy area ("third area").

BRIEF SUMMARY

In an aspect of this disclosure, there is provided a laminated structure that includes a wettability variable layer containing a wettability variable material whose surface energy changes when energy is applied thereto and including at least a high surface energy area having high surface energy and a low surface energy area having low surface energy; and a conductive layer disposed on the high surface energy area. The conductive layer includes a first high surface energy area, a second high surface energy area smaller in width than the first high surface energy area, and a third high surface energy area smaller in width than the second high surface energy area. The first high surface energy area and the second high surface energy area are connected by the third high surface energy area.

BRIEF DESCRIPTION OF THE DRAWINGS

FIG. 1 shows a manufacturing technique of a conventional laminated structure;

FIGS. 3A and 3B relate to the method for forming the laminated structure according to the embodiment of the present invention, and show Process BB of forming a high surface energy area and a low surface energy area by applying energy to the wettability variable layer;

FIGS. 4A and 4B relate to the method for forming the laminated structure according to the embodiment of the present invention, and show Process CC of selectively supplying a functional fluid to a first area and a second area formed on the wettability variable layer using a functional fluid supply means;

FIGS. 5A and 5B relate to the method for forming the laminated structure according to the embodiment of the present invention, and show Process CC of selectively supplying the functional fluid to the first area and the second area formed on the wettability variable layer using a functional fluid supply means;

FIGS. 6A and 6B relate to the method for forming the laminated structure according to the embodiment of the present invention, and show Process DD of forming electrodes by drying and solidifying the functional fluid that has spread across the first area, the second area and a third area;

FIGS. 8A and 8B show a principle of flow of the functional fluid;

FIGS. 9A and 9B illustrate a method for controlling thickness of a layer based on the principle of the flow of the functional fluid;

FIGS. 15A-15C show configurations of active matrix substrates of Example 2.

DETAILED DESCRIPTION OF THE PREFERRED EMBODIMENTS

A preferred embodiment in accordance with the present invention is described hereinafter with reference to the accompanying drawings.

Embodiments

Laminated Structure Forming Method

A laminated structure forming method according to one embodiment of the present invention includes the steps of applying energy onto a wettability variable layer to thereby form, on the wettability variable layer, a high surface energy area having high wettability for a functional fluid containing a conductive material and a low surface energy area having low wettability for the functional fluid; and selectively supplying the functional fluid only to the high surface energy area using a functional fluid supply means. A first characteristic of the forming method is that the high surface energy area includes a first area; a second area smaller in width than the first area; and a third area smaller in width than the second area, that connects the first area and the second area. A second characteristic of the forming method is that the functional fluid is selectively supplied only to the first area and the second area using the functional fluid supply means, and conductive components are formed over the entire surfaces of the first, second and third areas due to the flow of the functional fluid. As shown in FIGS. 2 through 6, the laminated structure forming method includes Process AA (FIGS. 2A and 2B) of forming, on a substrate, the wettability variable layer containing a wettability variable material; Process BB (FIGS. 3A and 3B) of applying energy onto the wettability variable layer to form the high surface energy area and the low surface energy area; Process CC (FIGS. 4A, 4B, 5A and 5B) of, using the functional fluid supply means, selectively supplying the functional fluid only to the first area and the second area formed on the wettability variable layer; and Process DD (FIG. 6) of forming a functional material pattern by drying the functional fluid that has spread over the entire surfaces of the first, second and third areas.

Figure 2B:
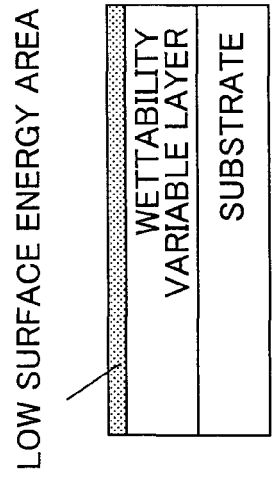
FIGS. 2A and 2B relate to a method for forming a laminated structure according to an embodiment of the present invention, and show Process AA of forming a wettability variable layer containing a wettability variable material on a substrate.
Figure 2A:
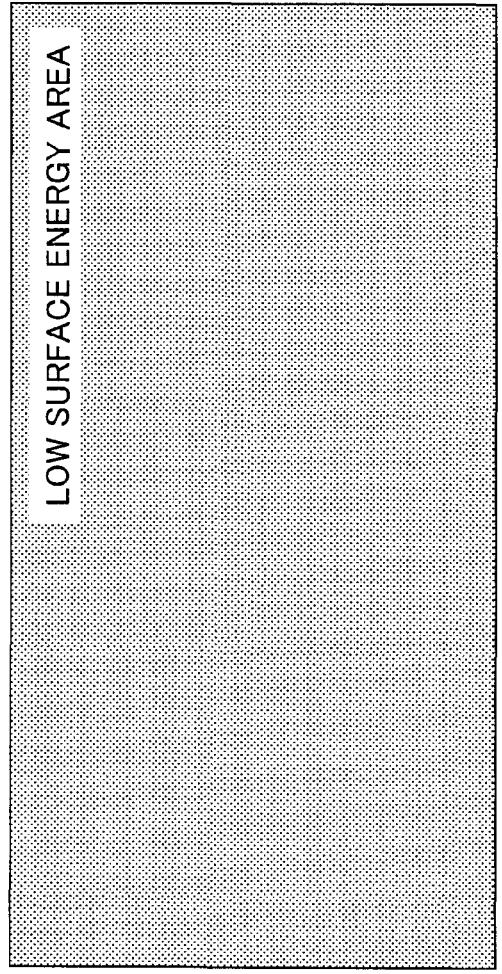

In Process AA, a wettability variable material is applied to the substrate by spin-coating, for example, and is subsequently dried to form the wettability variable layer. The wettability variable layer may be made from a single material, or two or more materials instead. As the substrate, for example, a glass substrate, a silicon substrate, a stainless substrate or a film substrate may be used. Examples of film substrates include a polyimide (PI) substrate, a polyether sulphone (PES) substrate, a polyethylene terephthalate (PET) substrate, and a polyethylene naphthalate (PEN) substrate. The wettability variable material contained in the wettability variable layer changes its surface energy (critical surface tension) when energy is applied thereto. Specifically, the wettability variable material is a polymer material in which the side chains bonded to the main chain include hydrophobic groups. When energy, such as ultraviolet light, is applied to the polymer material, the energy breaks the bonds of the hydrophobic groups, and hydrophilic groups are formed in the area to which energy was applied. Herewith, the surface energy of the polymer material changes, which results in a change in the wettability for the functional fluid to be described below. The hydrophobic groups are preferably fluoroalkyl groups having fluorine atoms or hydrocarbon groups having no fluorine atom, for example. The polymer material is preferably a material excellent in solvent resistance, heat resistance and insulation performance, and polyimide is a particularly preferable example. Excellent solvent resistance widens the choice of solvents included in the functional fluid at the time when the functional fluid is supplied (to be described later). Excellent heat resistance allows the wettability variable layer to resist heat in a heat treatment process used for, for example, drying the functional fluid (to be described later). Excellent insulation performance makes it possible to form conductive components on a foundation layer having excellent electrical isolation. After application and drying of the wettability variable material, the low surface energy area is formed over the entire substrate surface, as shown in FIGS. 2A and 2B. Patent Document 1 provides details of the above-mentioned wettability variable material and wettability variable layer, and therefore detailed descriptions are omitted herein.

Next, in Process BB, the surface energy of the wettability variable layer is changed by application of energy. Energy applied to the wettability variable layer may be heat, ultraviolet light, an electron beam or plasma. For example, if the wettability variable layer is exposed to ultraviolet light using a photomask, an area exposed to ultraviolet light becomes a high surface energy area. In this manner, a low surface energy area and a high surface energy area are formed, as shown in FIGS. 3A and 3B. The high surface energy area includes a first area; and a second area adjacent to the first area and smaller in width than the first area. With Processes AA and BB, the surface treatment of the wettability variable layer is completed. That is, the surface treatment of the wettability variable layer according to one embodiment of the present invention includes the following two steps: (1) formation of a foundation layer (coating and baking); and (2) exposure of the foundation layer to energy (mask exposure), and therefore, the operation is significantly simpler than one disclosed in Patent Document 3 which requires photolithography.

Next, in Process CC, the functional fluid containing a conductive material is selectively supplied only to the first and second areas on the wettability variable layer, as shown in FIGS. 4A and 4B, using a functional fluid supply means. As the functional fluid supply means, an inkjet method and a dispenser method are conceivable; however, the inkjet method is more preferable since the functional fluid can be supplied to the first and second areas in the form of microdroplets without contact to these areas but with high accuracy.

Figure 7:
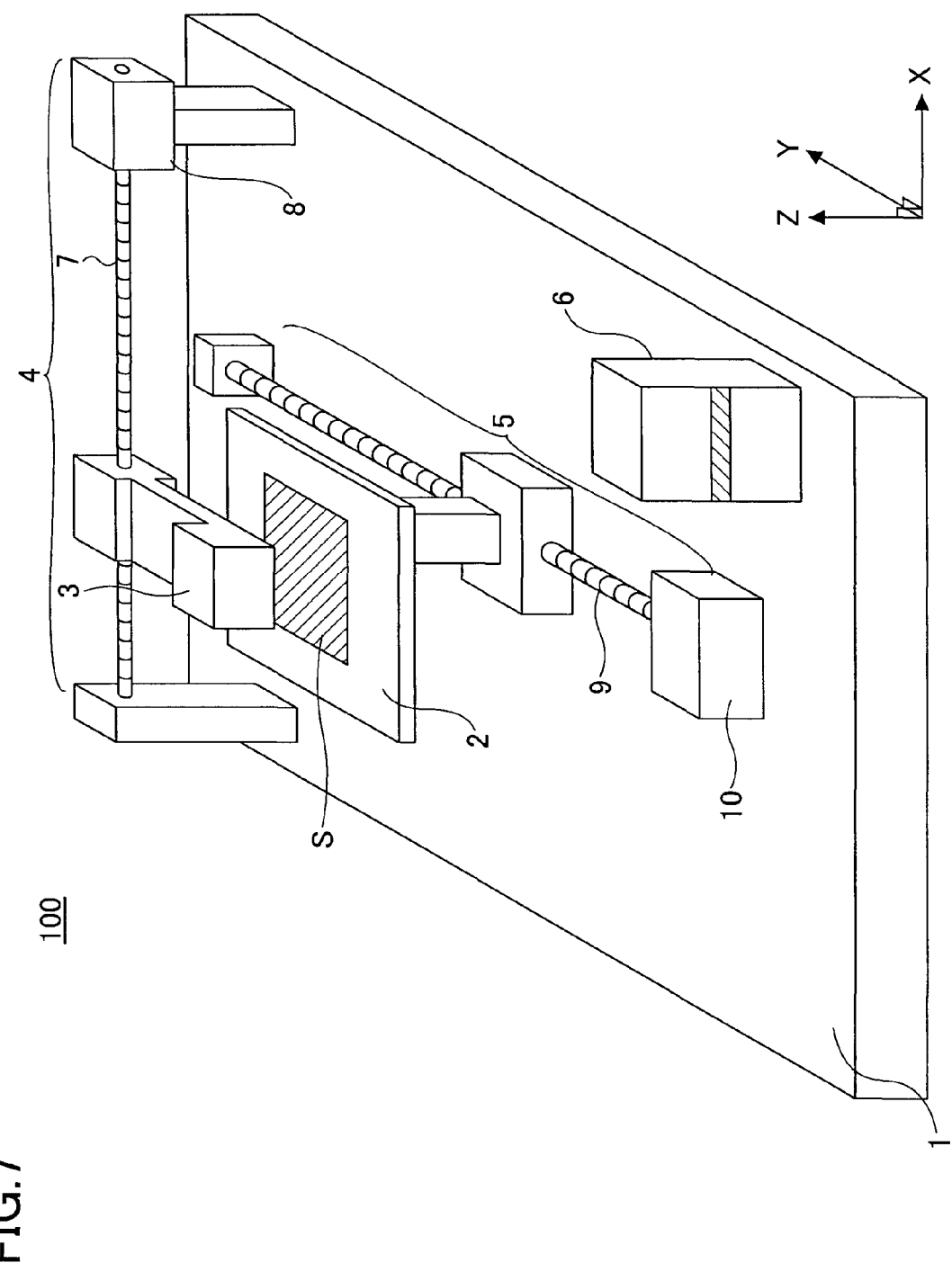
FIG. 7 shows an inkjet apparatus used as the functional fluid supply means to form conductive components in the method for forming the laminated structure according to an embodiment of the present invention.

An inkjet apparatus, which is a representative example of a functional fluid supply means used in the laminated structure forming method according to one embodiment of the present invention, is described with reference to FIG. 7. The inkjet apparatus includes a surface plate 1, a stage 2, a droplet discharge head 3, an X-axis direction movement mechanism 4 connected to the droplet discharge head 3, a Y-axis direction movement mechanism 5 connected to the stage 2, and a control device 6. The stage 2 supports a substrate S when an ink containing a functional material—i.e. the functional fluid—is supplied to the substrate S using the inkjet apparatus. The stage 2 includes a fixation mechanism, such as a suction device (not shown), for holding the substrate S. The stage 2 may also be equipped with a heating mechanism for drying a solvent of the functional fluid jetted onto the substrate S. The droplet discharge head 3 has, on its lower face, multiple discharge nozzles arranged at regular intervals in the X-axis direction. The functional fluid is jetted from the discharge nozzles onto the substrate S held on the stage 2. The droplet discharge head 3 may also include an ink-jetting mechanism including, for example, piezoelectric elements. In this case, when a voltage is applied to the piezoelectric elements connected to the control device 6, droplets are jetted from the discharge nozzles. The X-axis direction movement mechanism 4 includes an X-axis direction drive shaft 7 and an X-axis direction drive motor 8. The X-axis direction drive motor 8 is implemented by, for example, a stepper motor. When an X-axis direction driving signal is supplied from the control device 6, the X-axis direction drive motor 8 operates the X-axis direction drive shaft 7 and thereby moves the droplet discharge head 3 in the X-axis direction. The Y-axis direction movement mechanism 5 disposed perpendicular to the X-axis in a single plane includes a Y-axis direction drive shaft 9 and a Y-axis direction drive motor 10. When a Y-direction driving signal is supplied from the control device 6, the stage 2 moves in the Y-axis direction. The control device 6 supplies a jetting control signal to the droplet discharge head 3, an X-axis direction driving signal to the X-axis direction drive motor 8, and a Y-axis direction driving signal to the Y-axis direction drive motor 10. The control device 6 is connected to each of the droplet discharge head 3, the X-axis direction drive motor 8 and the Y-axis direction drive motor 10(b)y wiring (not shown). The inkjet apparatus causes the droplet discharge head 3 to jet droplets onto the substrate S held on the stage 2 while moving the droplet discharge head 3 and the stage 2 relative to each other. The inkjet apparatus may also include, between the droplet discharge head 3 and the X-axis direction movement mechanism 4, a rotation mechanism which operates independently from the X-axis direction movement mechanism 4. The rotation mechanism changes the relative angle between the droplet discharge head 3 and the stage 102 and thereby adjusts the pitch between the inkjet nozzles. Also, the inkjet apparatus may include, between the droplet discharge head 3 and the X-axis direction movement mechanism 4, a Z-axis direction movement mechanism which operates independently from the X-axis direction movement mechanism 4. The Z-axis direction movement mechanism moves the droplet discharge head 3 in the Z-axis direction and thereby arbitrarily adjusts the distance between the substrate S and the nozzle surface of the droplet discharge head 3. Further, the inkjet apparatus may include, between the stage 2 and the Y-axis direction movement mechanism 5, a rotation mechanism which operates independently from the Y-axis direction movement mechanism 5. The rotation mechanism rotates stage 2, on which the substrate is held, and thereby allows droplets to be jetted onto the substrate S tilted at a specified angle.

The functional fluid is an ink containing a functional material and used in a functional fluid supply means. The functional fluid contains any one of a conducting material, a semiconductor and an insulator, dispersed or dissolved in a solvent. Particularly in the case where a conducting material is used as the functional material, the following may be used: a so-called nanometal ink obtained by dispersing microparticles of metal, such as Au, Ag, Cu, Al, Ni or Pd, in a solvent; or a conductive polymer aqueous solution made by doping doped PANI (polyaniline) or PEDOT (polyethylene dioxithiophene) with PSS (polystyrene sulfonate). A primary property required for the functional fluid is enabling the droplet discharge head 3 to jet the functional fluid in a stable manner. The surface tension of the functional fluid is preferably between 20 and 50 mN/m inclusive, and more preferably about 30 mN/m to stabilize the meniscus of the functional fluid at the nozzle tip of the droplet discharge head 3 and to stabilize the shapes and speeds of traveling droplets of the functional fluid jetted from the droplet discharge head 3. The viscosity of the functional fluid is preferably between 2 mPa·s and 50 mPa·s inclusive. More preferably, the viscosity of the functional fluid is as low as possible within the above range so that the functional fluid supplied to the first area efficiently flows into the third area.

The functional fluid is jetted respectively onto the first area and the second area by the inkjet method, and the functional fluid jetted onto the first area flows into the third area, and consequently, the functional fluid spreads across the first, second and third areas, as shown in FIGS. 5A and 5B.

Finally, in Process DD, the functional fluid that has spread across the high surface energy area, as shown in FIGS. 6A and 6B, is dried and solidified to form conductive components. Methods for drying the functional fluid include a convection heat transfer method using, for example, an oven; a conductive heat transfer method using, for example, a hot plate; and a radiant heat transfer method using far-infrared rays or microwaves. Drying is not necessarily performed at atmospheric pressure but may be done at a reduced pressure. Additionally, the dried and solidified electrodes may be heat-treated. In particular, when a nanometal ink is used as the functional fluid, it is difficult to achieve sufficient electrical conductivity just by solidifying the functional fluid, and therefore, it is necessary to fuse nanoparticles by heat-treating the functional fluid.

Thus, according to Processes AA through DD, the laminated structure of one embodiment of the present invention is formed.

Principle of Invention

The following gives a detailed description of how to supply the functional fluid across the entire first, second and third areas by the flow of the functional fluid in the process of forming a laminated structure using the above-mentioned manufacturing method.

First is explained the principle of flow of the functional fluid. Let us consider the case where two high surface energy areas having different widths are connected, as shown in FIG. 8A. FIG. 8A shows an example in which the extension direction of the first area is aligned with that of the second area. In this case, a width W1 of the first area and a width W2 of the second area are defined as widths in a direction perpendicular to the extension direction. If the functional fluid is present both in the first and the second areas, the functional fluid ideally has a cross-sectional shape of a truncated circle both in the first and the second areas. The internal pressure of the functional fluid, generally known as Laplace pressure, is in inverse proportion to the radius of curvature of the cross-sectional shape of the functional fluid. Therefore, when a radius of curvature R1 of the functional fluid on the first area is different from a radius of curvature R2 of the functional fluid on the second area—that is, when the internal pressure of the functional fluid on the first area is different from that of the functional fluid on the second area, flow of the functional fluid occurs due to the difference in the internal pressure between the first and the second areas. Therefore, in order to cause the functional fluid to efficiently flow from the first area to the second area after selectively supplying the functional fluid only to the first area, the radius of curvature R1 is desirably smaller than the radius of curvature R2. A radius of curvature R can be found by the following equation:

$$R = W/2 \, \text{SIN}(\theta)$$

where W is a width of a corresponding high surface energy area, and $\theta$ is an angle between a tangent to the surface of the functional fluid and the surface of the high surface energy area at the boundary between the high and the low surface energy areas. As is apparent from the above equation, the internal pressure of the functional fluid becomes higher as the width W of the high surface energy area is smaller, and also as the angle $\theta$ is larger.

Further, let us consider an angle $\theta 1$ between a tangent to the surface of the functional fluid and the surface of the first area at the boundary between the first area and the low surface energy area; and an angle $\theta 2$ between a tangent to the surface of the functional fluid and the surface of the second area at the boundary between the second area and the low surface energy area. An angle maximizing the internal pressure of the functional fluid on the first area does not allow the functional fluid to flow from the first area to the low surface energy area. This is a contact angle $\theta'$ of the functional fluid on the low surface energy area. Also, an angle minimizing the internal pressure of the functional fluid on the second area is the minimum possible angle that the functional fluid can form on the high surface energy area. Namely, this is a contact angle $\theta''$ of the functional fluid on the high surface energy area. Accordingly, in order to allow the functional fluid to efficiently flow from the first area to the second area, it is essential that the maximum internal pressure of the functional fluid on the first area is larger than the minimum internal pressure of the functional fluid on the second area. This condition is defined by the relationship among a ratio between the width W1 of the first area and the width W2 of the second area; the contact angle $\theta''$ of the functional fluid with the high surface energy area; and the contact angle $\theta'$ of the functional fluid with the low surface energy area. If the condition is satisfied and a predetermined amount of the function fluid is supplied to the first area, the functional fluid flows from the first area to the second area. On the other hand, if the condition is not met, for example, when W2 is too small relative to W1, the minimum internal pressure of the functional fluid on the second area exceeds the maximum internal pressure of the functional fluid on the first area. In this case, even if additional functional fluid is supplied to the first area, the functional fluid does not flow from the first area to the second area, and eventually the functional fluid runs over to the low surface energy area from the first area.

The above description is based on the assumption that the cross-sectional shapes of the functional fluid on the first area and the second area are the same, and does not take into account influence of the viscosity of the functional fluid on its fluidity and influence of drying of the functional fluid. Nevertheless, whether the functional fluid flows from the first area to the second area depends on the above-mentioned condition, that is, the relationship among the ratio between the width W1 of the first area and the width W2 of the second area; the contact angle θ" of the functional fluid with the high surface energy area; and the contact angle θ' of the functional fluid with the low surface energy area. In order to achieve the laminated structure according to one embodiment of the present invention, this relationship plays an important role.

Figure 9B:
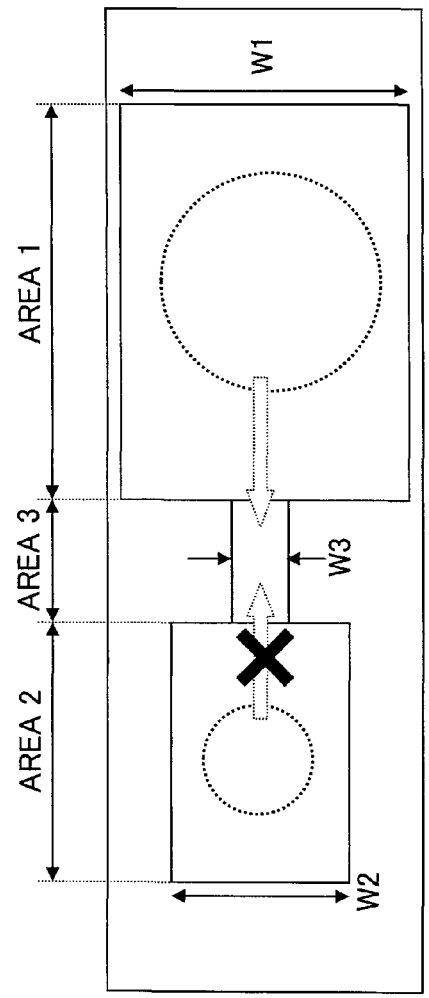

Next is described a method for controlling a layer thickness based on the above-mentioned principle of the flow of the functional fluid. FIGS. 9A and 9B compare a conventional method and a method according to one embodiment of the present invention. According to the conventional technique, the layer thickness cannot be made uniform since the functional fluid readily flows from the second area on which the functional fluid has a high internal pressure (i.e. a small radius of curvature) to the first area on which the functional fluid has a low internal pressure (i.e. a large radius of curvature) To address this problem, in one embodiment of the present invention, a third area is provided between the first area and the second area. As shown in FIG. 9B, the third area prevents the flow of the functional fluid between the first area and the second area. Herewith, it is possible to reduce the difference in the amount of the functional fluid per unit cross-sectional area between the first area and the second area. Since the first, second and third areas are formed by applying energy (e.g. ultraviolet light), as described above, in such a manner to have defined widths with high accuracy, the flow of the functional fluid can be accurately controlled due to the widths of these areas, whereby the layer thickness is also accurately controlled. In order to obtain a uniform layer thickness, it is important to prevent the functional fluid from flowing from the second area having a high internal pressure to the third area. That is, the relationship between the widths of the second area and the third area is important.

Laminated Structure

Figure 10A:
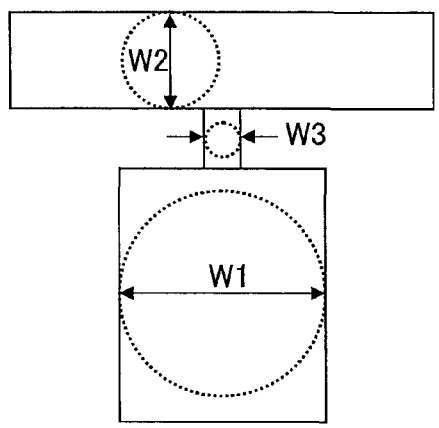
FIGS. 10A-10E relate to the method for forming the laminated structure according to an embodiment of the present invention, and show various patterns and shapes of a first, second and third conductive region.
Figure 10B:
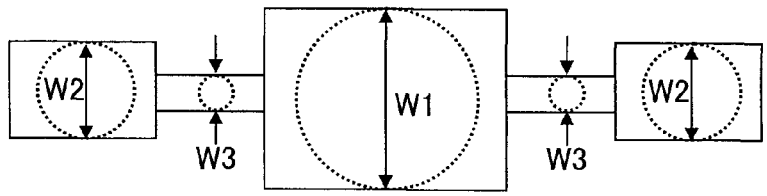
Figure 10C:
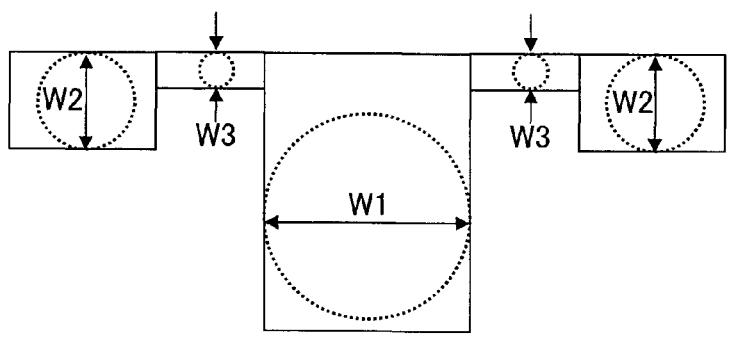

Next is described a laminated structure according to an embodiment of the present invention. The laminated structure includes a wettability variable layer containing a wettability variable material whose surface energy changes when energy is applied thereto and including at least a high surface energy area having high surface energy and a low surface energy area having low surface energy; and a conductive layer disposed on the high surface energy area. The high surface energy area includes a first area (corresponding to a first conductive region), a second area (corresponding to a second conductive region) smaller in width than the first area, and a third area (corresponding to a third conductive region) smaller in width than the second area. The first area and the second area are connected by the third area. FIGS. 10A and 10C show examples in which the first conductive region extending in an arbitrary direction is connected to the second conductive region extending in a direction perpendicular to the extension direction of the first conductive region by the third conductive region(s). FIG. 10B shows an example in which the second conductive region extends in the same direction as the extension direction of the first conductive region. In each example, the widths of the first, second and third conductive regions are shown. The term "width" herein refers to a dimension of each conductive region measured perpendicular to the extension direction of the conductive region.

Figure 10D:
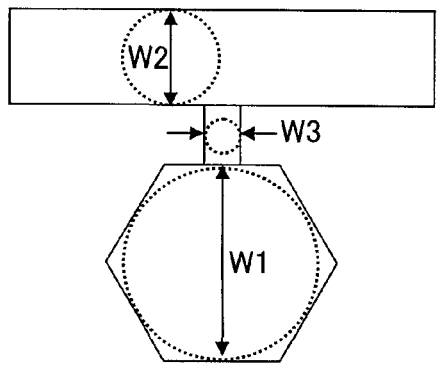
Figure 10E:
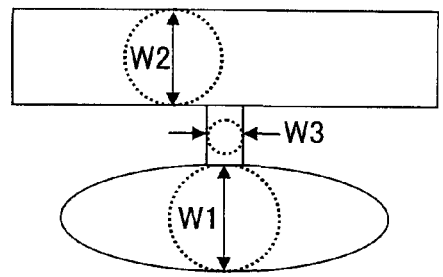

The shapes of the first and second conductive regions are not limited to the above-mentioned case where each conductive region extends in an arbitrary direction. Each region may have an arbitrary shape, for example, a regular polygon, a polygonal shape, a perfect circle or an ellipse. In such a case, the width of each conductive region is defined as the diameter of the smallest circle inscribed in the conductive region. Specifically, in the case of a regular polygon (FIG. 10D), the width is the diameter of a circle inscribed in the regular polygon; in the case of a polygonal shape, the diameter of the smallest circle touching internally three adjacent sides of the polygonal shape; in the case of a perfect circle, the diameter; and in the case of an ellipse, the minor axis of the ellipse (FIG. 10E). Having said that, the shape of the first electrode is preferably a regular polygon or a perfect circle in order to cause the functional fluid to steadily flow from the first conductive region to the third conductive region.

Similarly, the shape of the third electrode is not limited to the above-mentioned case where the conductive region extends in an arbitrary direction, and the third electrode may have a meander shape. Nonetheless, in order to cause the functional fluid to steadily flow from the first conductive region to the third conductive region, it is preferable that the third conductive region extend in an arbitrary direction. The definition of the width in this case is the same as given above.

Figure 11A:
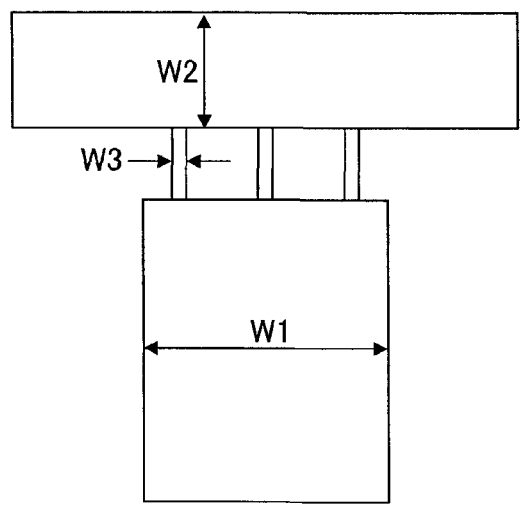
FIGS. 11A-11C show the laminated structure on which multiple third conductive regions are provided according to one embodiment of the present invention.
Figure 11B:
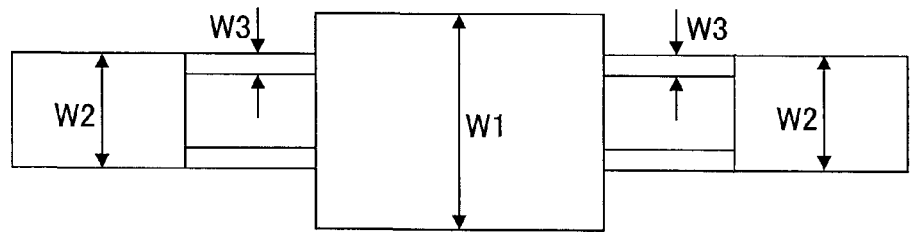
Figure 11C:
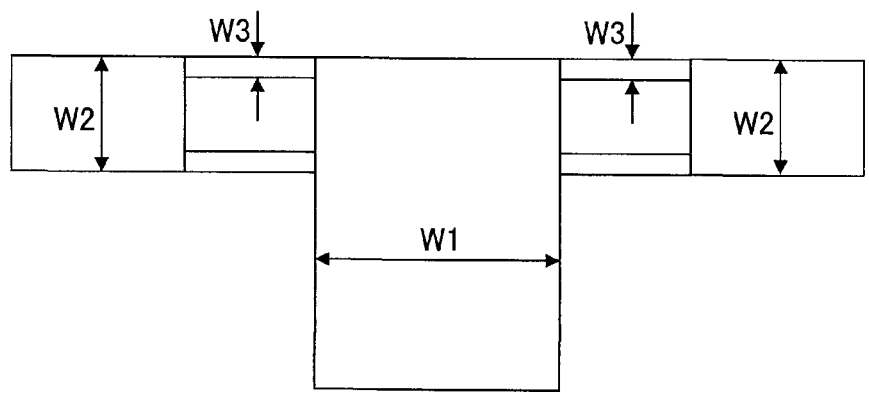

FIGS. 11A-11C show examples of laminated structures on which multiple third conductive regions are provided. According to these configurations, it is possible to stabilize the electrical connection between the first and second conductive regions by the multiple third conductive regions.

Figure 12A:
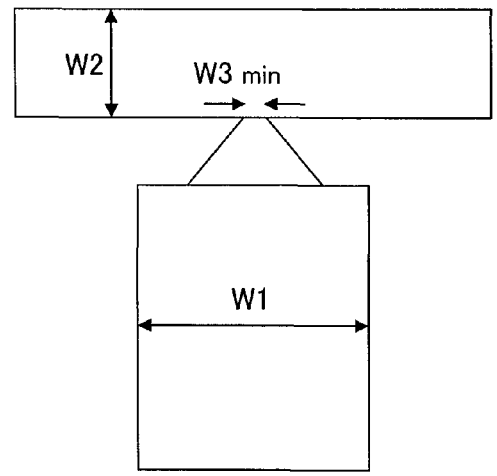
FIGS. 12A-12C show various patterns in which each third conductive region has a tapered shape according to one embodiment of the present invention.
Figure 12B:
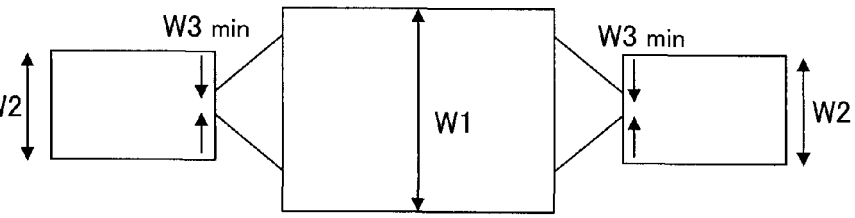
Figure 12C:
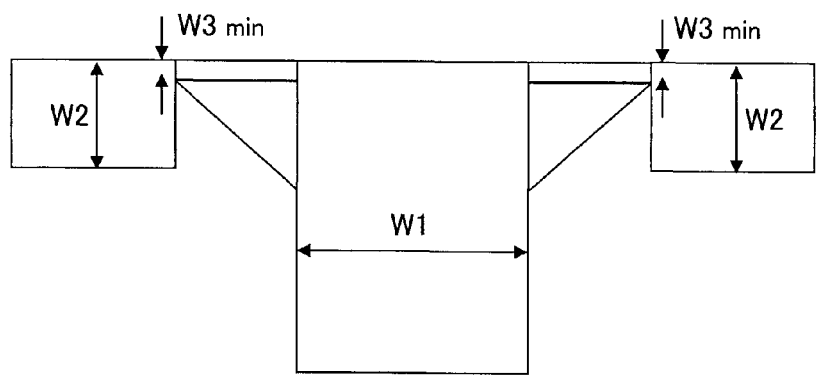

FIGS. 12A-12C show examples in which each third conductive region connecting the first and second conductive regions has a tapered shape, the minimum width of which is smaller than the width of the second conductive region. The tapered shape of the third conductive region is such that the side in contact with the second conductive region is smaller in width than the side in contact with the first conductive region. According to the configuration, it is possible to cause the functional fluid to flow smoothly from a high surface energy area corresponding to the first conductive region to a high surface energy area corresponding to the third conductive region. This makes it possible to stabilize the electrical connection between the first and second conductive regions.

One embodiment of the present invention offers a multilayer wiring board including at least a substrate, an insulating layer and an electrode layer. The multilayer wiring board also includes the laminated structure, and at least a part of the electrode layer is implemented by a conductive layer formed on the high surface energy area of the laminated structure.

Furthermore, the electrode layer may include conductive components (e.g. a gate electrode and a gate signal line, or a capacitor electrode and a common signal line), and the multilayer wiring board may further include a semiconductor layer; and another electrode layer (including conductive components, such as source and drain electrodes) in contact with the semiconductor layer. The insulating layer, the two electrode layers and the semiconductor layer form an electronic device on the substrate. That is, it is possible to offer a substrate having thereon an electronic device, such as a diode, a transistor, a photoelectric transducer or a thermoelectric transducer.

Another embodiment of the present invention offers a matrix substrate on which multiple pieces of the above-mentioned substrates are arranged, for example, in an array structure (i.e. a substrate on which electronic devices are arranged in an array structure).

Furthermore, another embodiment of the present invention offers an active matrix substrate, which is an example of the above-mentioned matrix substrate.

Active Matrix Substrate

Figure 13B:
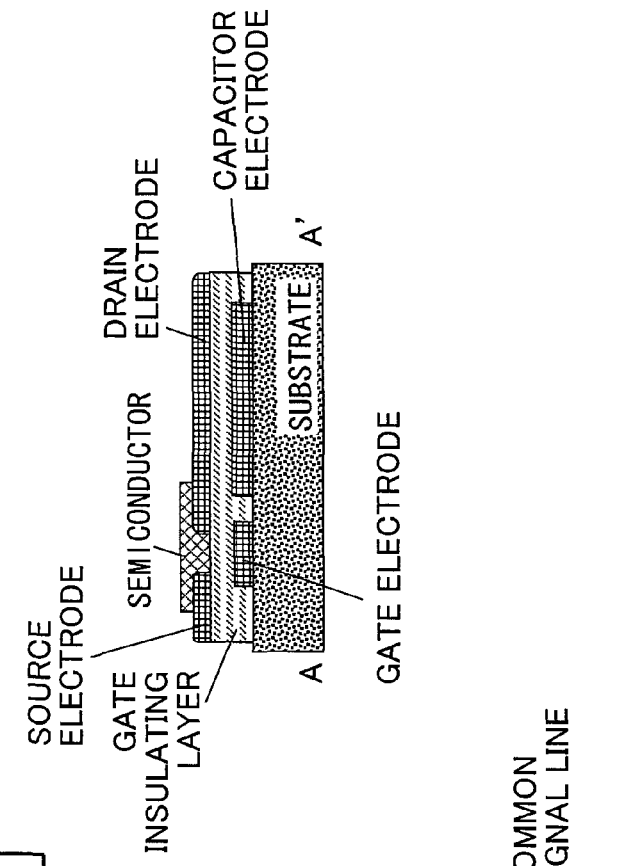
FIGS. 13A and 13B show a configuration of an active matrix substrate including the laminated structure of one embodiment of the present invention.
Figure 13A:
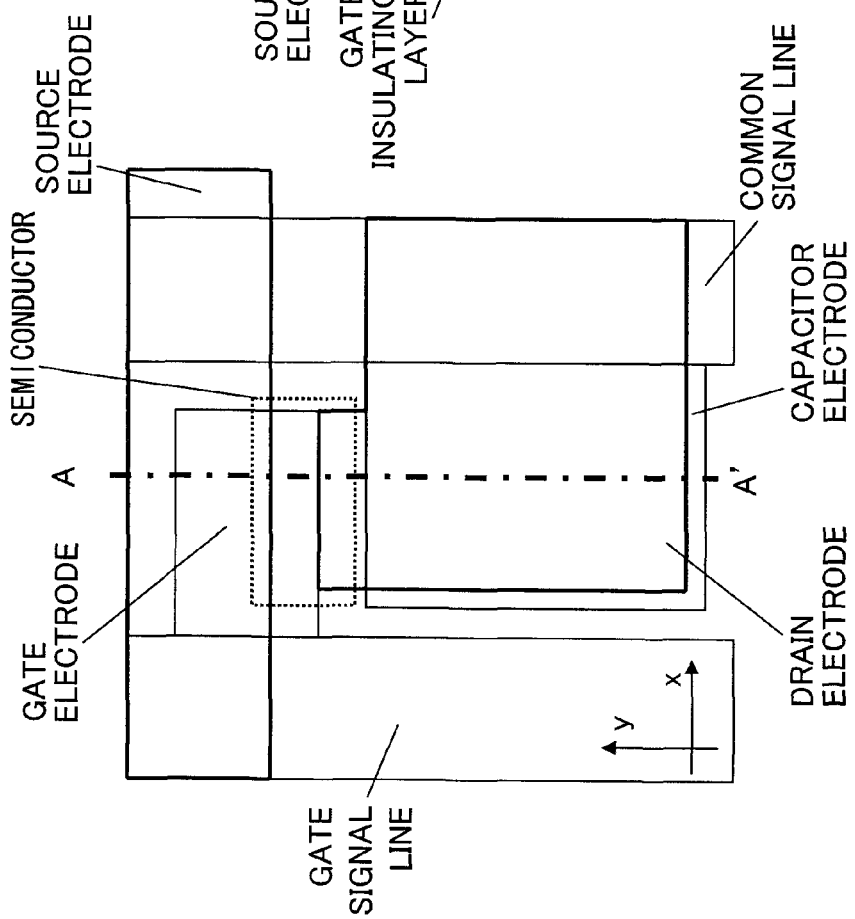
Figure 14A:
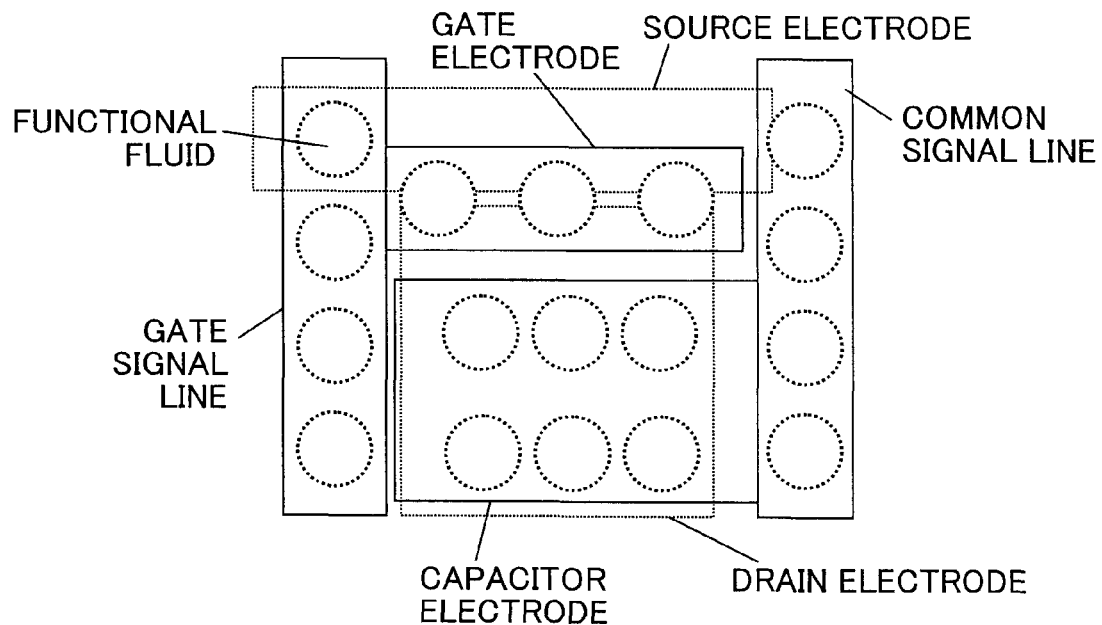
FIGS. 14A and 14B relate to the active matrix substrate of one embodiment of the present invention, and show a configuration of the active matrix substrate in which third conductive regions are provided when forming a capacitor electrode and a common signal line.
Figure 14B:
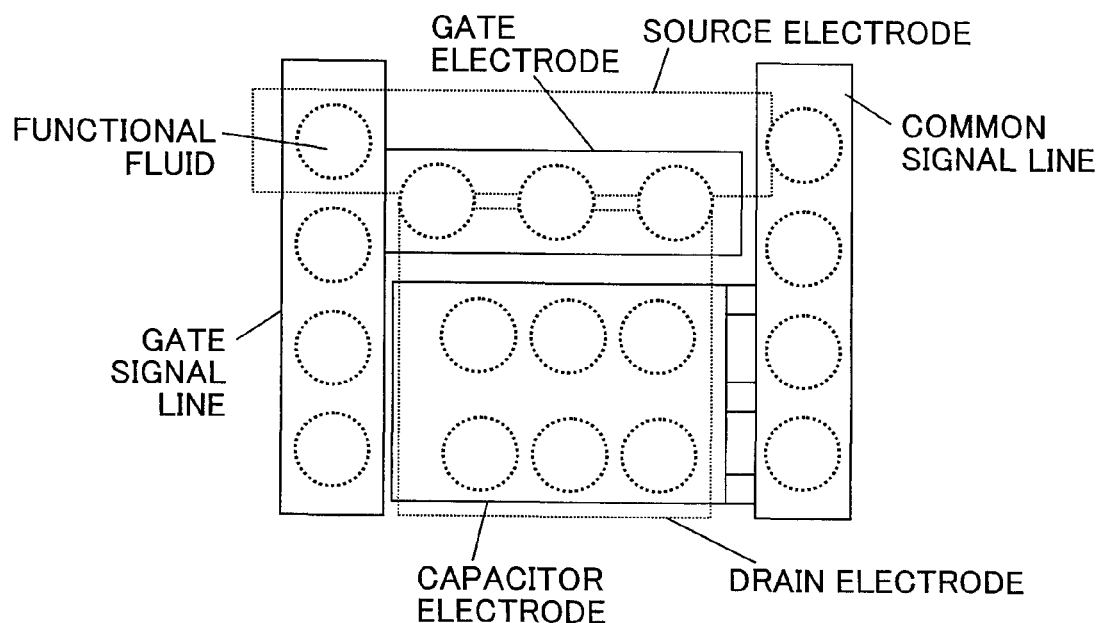

Next is described a structure of an active matrix substrate to which the laminated structure of one embodiment of the present invention is applied. The active matrix substrate includes a transistor including a gate electrode, a gate insulating layer, a source electrode, a drain electrode, a capacitor electrode and a semiconductor; a gate signal line extending from the gate electrode in an arbitrary direction; a source signal line extending from the source electrode in a direction perpendicular to the direction of the gate signal line; and a common signal line extending from the capacitor electrode in a direction substantially parallel to the direction of the gate signal line or the source signal line. FIGS. 13A and 13B show an exemplary configuration of the active matrix substrate. FIGS. 14A and 14B show a comparison between a conventional method and a method according to one embodiment of the present invention for forming the capacitor electrode and the common signal line. Note that FIGS. 14A and 14B do not show a semiconductor for the sake of simplicity. As shown in FIG. 13A, since the capacitor electrode is connected to the common signal line, the capacitor electrode is always supplied with a constant (common) potential. The capacitor electrode forms a capacitor between itself and the drain electrode that opposes the capacitor electrode across the gate insulating layer, and thus serves to store charge carriers to be injected into the drain electrode when the transistor operates. In order to increase the capacity for charge carrier storage, it is preferable that the area of the capacitor be made as large as possible, which however, requires to make the common signal line as small in width as possible. As a result, there is a large difference in width between the capacitor electrode and the common signal line. In this condition, if the functional fluid is supplied, as shown in FIG. 14A, the functional fluid flows from a high surface energy area corresponding to the common signal line to a high surface energy area corresponding to the capacitor electrode, which results in a difference in thickness between these two areas. If the thickness of the capacitor electrode becomes larger than that of the common signal line, the thickness of the gate insulating layer formed on the capacitor electrode becomes small or uneven. This leads to reducing the insulation performance of the gate insulating layer. Moreover, the common signal line becomes small in thickness due to the flow of the functional fluid, resulting in disconnection of the common signal line that is supposed to be conductive to supply a common potential. Accordingly, the conventional method has a difficulty in providing a reliable active matrix substrate. On the other hand, the forming method according to one embodiment of the present invention is characterized by providing, between the capacitor electrode and the common signal line, narrow electrodes each being smaller in width than the common signal line, as shown in FIG. 14B. Herewith, even if the capacitor electrode and common signal line are different in width, it is possible to make uniform the thicknesses of the capacitor electrode and the common signal line, thus allowing a reliable active matrix substrate to be provided.

Another embodiment of the present invention offers an electronic display apparatus including a matrix substrate (i.e. a substrate on which electronic devices are arranged in an array structure), for example, the above-mentioned active matrix substrate.

One exemplary configuration of the electronic display apparatus according to one embodiment of the present invention is such that another substrate having a transparent conductive film is provided on the above-mentioned active matrix substrate, and display elements are arranged between the two substrates. The other substrate may be made of glass or plastic, such as polyester, polycarbonate, polyarylate or poly ether sulfone. The display elements may be liquid crystal, electrophoretic or organic EL, for example. Accordingly, electronic display apparatuses according to embodiments of the present invention include image display apparatuses, such as a liquid crystal display apparatus, a plasma display panel and an organic EL display. For example, in an active matrix flat-panel image display apparatus that controls the light emission of each pixel, a great number of pixels having pixel electrodes are arranged on a substrate in rows and columns in a matrix structure.

EXAMPLES

Examples of the present invention are described below. It must be noted that the examples are presented only for the purpose of illustrating the present invention and do not limit the scope of the present invention.

Example 1

In Example 1, two high surface energy areas having different widths were provided, and conditions were examined under which the functional fluid flows to a narrower one of the high surface energy areas in the case of selectively supplying the functional fluid only to the wider high surface energy area.

First, an NMP solution containing a polyimide material was applied to a glass substrate by spin-coating. The polyimide material had alkyl groups in the side chains whose surface free energy changes when irradiated by ultraviolet light. Next, the NMP solution was pre-calcined in an oven at 100° C. and then calcined at 180° C. to remove the solvent to thereby form a wettability variable layer 1. Multiple wettability variable layers 1 were prepared to examine the flow of the functional fluid under different conditions where the widths W1 of the first area and W2 of the second area were varied. Each wettability variable layer 1 was exposed to ultraviolet light (UV) with a wavelength of 300 nm or less (using an ultra-high pressure mercury lamp) through a photomask having a certain pattern to form a corresponding pattern including a UV exposed area and a non-UV exposed area on the wettability variable layer 1. The UV exposed area forming a high surface energy area included the first area; and the second area having a width narrower than that of the first area. Next, the functional fluid containing a conductive material was supplied selectively to the first area by the inkjet method. As the functional fluid, a nanometal ink containing Ag was used. The surface tension of the functional fluid was about 30 mN/m and the viscosity was about 10 mPa·s. The contact angle of the functional fluid with the high surface energy area of the wettability variable layer 1 was 8° and the contact angle with the low surface energy area was 28°. The volume of a droplet of the functional fluid jetted from an inkjet head was 8 pl. Then, the functional fluid supplied to the first area was dried in an oven at 80° C. to remove the solvent, to thereby form a laminated structure. Various combinations of the width W1 of the first area and the width W2 of the second area on the wettability variable layer 1 were provided by changing those widths. After the formation of each laminated structure, the wettability variable layer 1 was examined by a metallurgical microscope. The results are summarized in Table 1. According to the results, the functional fluid is able to flow when the ratio between W1 and W2 does not exceed 6.0. In the case where the ratio exceeded 6.0, the flow of the functional fluid was restricted, and accordingly an electrode was formed only on a part of the second area.

TABLE 1

| W1 [μm] | W2 [μm] | W1/W2 | WETTABILITY VARIABLE LAYER |
|---|---|---|---|
| 80 | 40 | 2.0 | ○ |
| 80 | 20 | 4.0 | ○ |
| 80 | 10 | 8.0 | Δ |
| 120 | 40 | 3.0 | ○ |
| 120 | 20 | 6.0 | ○ |
| 120 | 10 | 12.0 | Δ |
| 200 | 40 | 5.0 | ○ |
| 200 | 20 | 10.0 | Δ |
| 200 | 10 | 20.0 | X |

○; ENTIRE AREA,
Δ; PARTIAL AREA
X; HARDLY FORMED

Example 2

In Example 2, based on an examination of the results of Example 1, the laminated structure according to one embodiment of the present invention was applied to an active matrix substrate as a structural component. FIGS. 15A-15C show configurations of the active matrix substrates of Example 2 to which the laminated structure were applied. The matrix substrate includes a substrate, a gate electrode, a capacitor electrode, a common signal line, a gate insulating layer, a source electrode and a drain electrode. FIGS. 15A-15C respectively show only a part of the active matrix substrate, which corresponds to one pixel; however, in reality, the active matrix substrate included 30×30 pixels. The size of each pixel was 317.5 μm that corresponded to 80 ppi. First, the NMP solution containing a polyimide material used in Example 1 was applied to a film substrate by spin-coating, and then calcined to thereby form a wettability variable layer 1 for a gate electrode. Next, the functional fluid was applied, by an inkjet method, onto the wettability variable layer 1 to form a gate electrode and a capacitor electrode each having a thickness of about 50 nm. Then a gate insulating layer with about 500 nm in thickness was formed also by spin-coating, and wettability variable layers 1 for source and drain electrodes were formed on top of the gate insulating layer. The wettability variable layer 1 of Example 1 was used for wettability variable layers 1 for both the gate electrode and the source and drain electrodes. The functional fluid used in the inkjet method is the Ag nanometal ink of Example 1. The contact angle of the functional fluid with the high surface energy area of the wettability variable layer 1 was 8° and the contact angle with the low surface energy area was 28°.

As shown in Table 2, the conventional electrode forming method and the electrode forming method according to one embodiment of the present invention were compared by changing the width of the third conductive region. It should be noted that the third electrode was shaped into a taper such that the width of its side in contact with the first conductive region was 100 μm in order to accelerate the flow of the functional fluid from the first conductive region while preventing the flow of the functional fluid from the second conductive region. Evaluation was made based on a conduction check on the common signal line and measurement of leakage current between the source electrode and the capacitor electrode. For the evaluation, various combinations of the widths—W1, W2 and W3—were provided by changing W3 as shown in Table 2, and ten active matrix substrates each having 30×30 pixels were examined with respect to each combination. A voltage applied between the source electrode and the capacitor electrode was 40 V, and an active matrix substrate was determined defective if a current density of 1 μA/cm² or larger flowed.

The results indicate that, as to the conventional active matrix substrate having no narrow electrode, all the examined samples were determined defective both in the conduction check and the leakage current measurement. On the other hand, as to the active matrix substrate according to one embodiment of the present invention, all the examined samples were determined as "good" both in the conduction check and the leakage current measurement if the flow of the functional fluid could be prevented. That is, if the condition found in Example 1 is satisfied (that is, W2/W3>6 in this case), the active matrix substrate according to one embodiment of the present invention is stable in quality.

TABLE 2

| W1 [μm] | W2 [μm] | W3 [μm] | CONDUCTION CHECK | LEKAGE CURRENT CHECK |
|---|---|---|---|---|
| 200 | 80 | 5 | ○ | ○ |
| 200 | 80 | 10 | ○ | ○ |
| 200 | 80 | 20 | ○ | Δ |
| 200 | 80 | 40 | Δ | X |
| 200 | 80 | 80 | X | X |
| 200 | 80 | — | X | X |

○; ALL GOOD,
Δ; GOOD 5≦,
X; ALL DEFECTIVE

According to one embodiment of the present invention, if the functional fluid is supplied respectively to the first area corresponding to a first conductive region and to the second area corresponding to a second conductive region, the flow of the functional fluid between the first area and the second area can be prevented by the third area corresponding to a third conductive region. Herewith, the thickness of the first and the second conductive regions can be controlled separately. This allows achieving a laminated structure including electrodes having a uniform thickness.

According to one embodiment of the present invention, it is possible to reduce the difference between the force of the functional fluid to flow from the first area to the third area and the force of the functional fluid to flow from the second area to the third area. This results in an improvement in the yield of the connection between the first conductive region and the second conductive region.

According to one embodiment of the present invention, it is possible to improve the yield of the connection between the first conductive region and the second conductive region, and further to reduce the resistance at the connection.

According to one embodiment of the present invention, the physical properties of the functional fluid are determined as follows: the contact angle with the high surface energy area is 8° or less; the contact angle with the low surface energy area is 28° or more; a ratio of the width of the first area to the width of the third area is 6 or less, and a ratio of the width of the second area to the width of the third area is more than 6; the surface tension is between 20 and 50 mN/m inclusive; and the viscosity is between 2 and 50 mPa·s inclusive. Under these conditions, it is possible to form the conductive regions in a reliable manner.

One embodiment of the present invention allows effective use of the functional fluid with lesser number of processing steps to obtain a laminated structure having a uniform layer thickness. Herewith, it is possible to utilize the advantages of a functional fluid supply means, such as an inkjet method.

The laminated structure forming method according to one embodiment of the present invention employs an inkjet method capable of supplying microdroplets. This allows the functional fluid to be more sensitive to the influence of the surface energy of the wettability variable layer 1, which in turn allows microfabrication of electrodes in the laminated structure. Also in the case where a functional fluid having a high fluidity and a low viscosity is used in the inkjet method, it is possible to obtain electrodes having a uniform thickness.

According to one embodiment of the present invention, a multilayer wiring board having stable properties can be achieved inexpensively by incorporating electrodes having a uniform thickness.

According to one embodiment of the present invention, it is possible to provide a substrate which includes a high-performance electronic device having stable properties.

According to one embodiment of the present invention, a stable matrix substrate can be achieved inexpensively by incorporating electrodes having a uniform thickness.

According to one embodiment of the present invention, an active matrix substrate having stable properties can be achieved inexpensively by incorporating electrodes having a uniform thickness.

According to one embodiment of the present invention, lower-layer electrodes disposed under the insulating layer have a uniform thickness. Herewith, it is possible to inexpensively achieve an active matrix substrate that includes a high performance transistor having excellent insulating properties.

According to one embodiment of the present invention, it is possible to achieve easily and inexpensively a high-performance electronic display apparatus having stable properties.

In one embodiment of the present invention, the laminated structure is configured such that the first conductive region is connected to the second conductive region smaller in width than the width of the first conductive region by the third conductive region smaller in width than the width of the second conductive region. Herewith, in the case where the functional fluid is supplied respectively to the first area corresponding to the first conductive region and to the second area corresponding to the second conductive region, it is possible to prevent the flow of the functional fluid between the first area and the second area by the third area corresponding to the third conductive region. Accordingly, the thickness of the first and the second conductive regions can be controlled separately. This allows achieving a laminated structure including conductive components, such as electrodes, having a uniform thickness. Furthermore, by incorporating the laminated structure, the present invention also provides wiring boards, such as multilayer wiring boards; matrix substrates, such as active matrix substrates; liquid crystal display apparatuses; and electronic display apparatuses, such as liquid crystal display apparatuses, plasma display panels and organic EL (Electroluminescence) displays.

Thus, the present invention has been described herein with reference to preferred embodiments thereof. While the present invention has been shown and described with particular examples, it should be understood that various changes and modification may be made to the particular examples without departing from the scope of the broad spirit and scope of the present invention as defined in the claims.

This application is based on Japanese Patent Application No. 2007-242751 filed in the Japan Patent Office on Sep. 19, 2007, the contents of which are hereby incorporated herein by reference.

What is claimed is:

1. A laminated structure, comprising:
   a wettability variable layer containing a wettability variable material whose surface energy changes when energy is applied thereto and including at least a high surface energy area having high surface energy and a low surface energy area having low surface energy; and
   a conductive layer disposed on the high surface energy area,
   wherein the conductive layer includes a first high surface energy area having a width W1, a second high surface energy area having a width W2 being smaller than W1, and a third high surface energy area having a width W3 being smaller than W2, and the first high surface energy area and the second high surface energy area are connected by the third high surface energy area.

2. The laminated structure as claimed in claim 1, wherein the third high surface energy area has a tapered shape, one side of which in contact with the second high surface energy area is smaller in width than another side in contact with the first high surface energy area.

3. The laminated structure as claimed in claim 1, wherein the conductive layer includes a plurality of the third high surface energy areas.

4. The laminated structure as claimed in claim 1, wherein the conductive layer is formed by an inkjet method using a functional fluid, a contact angle of the functional fluid with the high surface energy area is 8° or less and a contact angle of the functional fluid with the low surface energy area is 28° or more, a ratio of W1 to W3 is 6 or less, and a ratio of W2 to W3 is more than 6.

5. The laminated structure as claimed in claim 1, wherein the functional fluid has a surface tension between 20 and 50 mN/m inclusive and a viscosity between 2 and 50 mPa·s inclusive.

6. An active matrix substrate including the laminated structure as claimed in claim 1, comprising:
   a substrate;
   a transistor including a gate electrode, a gate insulating layer, a source electrode, a drain electrode, a capacitor electrode and a semiconductor;
   a gate signal line extending from the gate electrode in an arbitrary direction;
   a source signal line extending from the source electrode in a direction perpendicular to the gate signal line; and
   a common signal line extending from the capacitor electrode in a direction parallel to the direction of the gate signal line or the source signal line,
   wherein at least two out of the gate electrode, the source electrode, the drain electrode, the capacitor electrode, the gate signal line, the source signal line and the common signal line are implemented by the conductive layer formed on the high surface energy area of the laminated structure, the two being in contact with each other and disposed between the substrate and the gate insulating layer.

7. The laminated structure as claimed in claim 1, wherein each of the first, second and third high surface energy area of the conductive layer is disposed on the high surface energy area of the wettability variable layer.

8. A multilayer wiring board, comprising:
   a substrate;
   an insulating layer; and
   a first electrode layer,
   wherein the multilayer wiring board includes the laminated structure as claimed in claim 1, and at least a part of the first electrode layer is implemented by the conductive layer formed on the high surface energy area of the laminated structure.

9. The multilayer wiring board as claimed in claim 8, further comprising:
- a semiconductor layer; and
- a second electrode layer being in contact with the semiconductor layer and including regions corresponding to a pair of electrodes,
- wherein the insulating layer, the first electrode layer, the semiconductor layer and the second electrode layer together form an electronic device on the substrate.

10. A matrix substrate comprising a plurality of multilayer wiring boards, each of which includes:
- a substrate;
- a first electrode layer formed on the substrate;
- an insulating layer;
- a semiconductor layer; and
- a second electrode layer being in contact with the semiconductor layer and including regions corresponding to a pair of electrodes,
- wherein each of the multilayer wiring boards includes the laminated structure as claimed in claim 1, and at least a part of the first electrode layer is implemented by the conductive layer formed on the high surface energy area of the laminated structure.

11. An electronic display apparatus including the matrix substrate as claimed in claim 10.

12. An active matrix substrate including the laminated structure as claimed in claim 1 comprising:
- a substrate;
- a transistor including a gate electrode, a gate insulating layer, a source electrode, a drain electrode, a capacitor electrode and a semiconductor;
- a gate signal line extending from the gate electrode in an arbitrary direction;
- a source signal line extending from the source electrode in a direction perpendicular to the gate signal line; and
- a common signal line extending from the capacitor electrode in a direction parallel to the direction of the gate signal line or the source signal line,
- wherein at least two out of the gate electrode, the source electrode, the drain electrode, the capacitor electrode, the gate signal line, the source signal line and the common signal line are implemented by the conductive layer formed on the high surface energy area of the laminated structure, the two being disposed on the substrate and in contact with each other.

13. An electronic display apparatus including the active matrix substrate as claimed in claim 12.

* * * * *